United States Patent
Tehrani et al.

[11] Patent Number: 5,943,574
[45] Date of Patent: Aug. 24, 1999

[54] METHOD OF FABRICATING 3D MULTILAYER SEMICONDUCTOR CIRCUITS

[75] Inventors: Saied N. Tehrani, Tempe; Kumar Shiralagi, Chandler; Herbert Goronkin, Tempe, all of Ariz.

[73] Assignee: Motorola, Inc., Schaumburg, Ill.

[21] Appl. No.: 09/027,915

[22] Filed: Feb. 23, 1998

[51] Int. Cl.[6] .................................................. H01L 21/336
[52] U.S. Cl. ........................ 438/300; 438/153; 438/212; 438/585; 438/151; 438/166; 438/268
[58] Field of Search .................................. 438/300, 308, 438/268, 269, 138, 153, 151, 166, 585, 212, FOR 176, FOR 192; 148/DIG. 90

[56] References Cited

U.S. PATENT DOCUMENTS

| | | | |
|---|---|---|---|
| 4,794,092 | 12/1988 | Solomon | 438/666 |
| 5,214,296 | 5/1993 | Nakata et al. | 257/302 |
| 5,281,837 | 1/1994 | Kohyama | 257/302 |
| 5,409,852 | 4/1995 | Faure et al. | 438/424 |
| 5,414,289 | 5/1995 | Fitch et al. | 257/329 |
| 5,552,596 | 9/1996 | Ravetto et al. | 250/208.1 |
| 5,627,390 | 5/1997 | Maeda et al. | 257/302 |

OTHER PUBLICATIONS

S. Maeda et al., "Impact of a Vertical Φ–Shape Transistor (VΦT) Cell for 1 Gbit DRAM and Beyond", IEEE Transactions On Electron Devices, vol. 42, No. 12, Dec. 1995, pp. 2117–2124.

*Primary Examiner*—Michael Trinh
*Attorney, Agent, or Firm*—Robert F. Hightower; Eugene A. Parsons

[57] ABSTRACT

A method of fabricating 3D semiconductor circuits including providing a conductive layer with doped polysilicon thereon patterned and annealed to form first single grain polysilicon terminals of semiconductor devices. Insulated gate contacts are spaced vertically from the terminals so as to define vertical vias and polysilicon is deposited in the vias to form conduction channels. An upper portion of the polysilicon in the vias is doped to form second terminals for the semiconductor devices, and the polysilicon is annealed to convert it to single grain polysilicon. A second electrically conductive layer is deposited and patterned on the second terminal to define second terminal contacts of the semiconductor devices.

16 Claims, 3 Drawing Sheets

METHOD OF FABRICATING 3D MULTILAYER SEMICONDUCTOR CIRCUITS

FIELD OF THE INVENTION

The present invention pertains to semiconductor circuits and more specifically to three dimensional semiconductor circuits.

BACKGROUND OF THE INVENTION

Semiconductor technology is progressing very rapidly toward deep submicron geometries to minimize the die size and increase the circuit speed. As the geometries get to smaller dimensions, the interconnect capacitances rather than transistor switching speeds become the dominant factor limiting speed and density. In addition, the current semiconductor technology relies on high performance transistors that are arranged in 2-dimensional arrays. These transistors are fabricated in a single crystal material of silicon (Si) in order to accomplish the high mobility and low leakage current that result in good transistor threshold control, low voltage operation, high drive current, and high fan-out or gain. Also, as the critical lithography dimensions shrink the performance of the transistors laid out in a planar configuration will be limited by effects such as tunneling between gate to source and drain, and punch-through between the source and drain.

Existing polysilicon materials, generally formed from layers of amorphous silicon and annealed, are being developed to act as a switch or low performance driver for active matrix LCD displays. These devices suffer from low mobility and high leakage currents and the performances achieved with these transistors are very limited and are significantly poor compared to single crystal transistor performance.

Currently, CMOS circuits are made in a planar fashion and devices are interconnected by long metal lines (multilayer) that run from one part of the circuit to the other on top of an isolating dielectric. Vias are used to access the devices and multi-layer metals are used to increase the connectivity of devices. With increasing density and complexity of devices, circuits, and long metal lines, it is extremely difficult to interconnect devices in the same plane. The speed of the circuit is affected (and is becoming a limiting factor in many large circuits) because of long line length of interconnects and increased RC time constant. Clock skew, signal delays, and parasitic leakage, etc. affect the performance of the circuit.

In a planar circuit lay-out, the number of input/output leads are limited. Also, larger die sizes are being limited by tool field size of such tools as steppers.

Accordingly, it would be highly desirable to provide a convenient method of producing efficient three dimensional semiconductor circuits.

It is a purpose of the present invention to provide a new and improved method of producing 3D semiconductor circuits.

It is another purpose of the present invention to provide a new and improved method of producing 3D semiconductor circuits which increases density and minimizes interconnect lengths.

It is another purpose of the present invention to provide a new and improved method of producing 3D semiconductor circuits which is convenient and easy to perform without introducing additional cost and labor.

It is still another purpose of the present invention to provide a new and improved method of producing 3D semiconductor circuits capable of producing larger and more complicated semiconductor circuits with reduced RC time constants, clock skew, signal delays, and parasitic leakage.

It is a further purpose of the present invention to provide new and improved high performance semiconductor devices with high mobility and low leakage current that result in good transistor threshold control, low voltage operation, high drive current, and high fan-out or gain.

It is a still further purpose of the present invention to provide new and improved high performance 3D semiconductor circuits which can be made more complicated and with reduced RC time constants, clock skew, signal delays, and parasitic leakage.

SUMMARY OF THE INVENTION

The above problems and others are at least partially solved and the above purposes and others are realized in a method of fabricating three-dimensional semiconductor circuits by providing a first electrically conductive layer having a doped polysilicon layer positioned thereon and patterned into submicron geometries including first terminals of a first plurality of semiconductor devices. The doped polysilicon is annealed to expand the grains to avoid grain boundaries within a conductive portion of each of the first terminal semiconductor contacts. Insulated gate contacts are formed so as to be spaced vertically from the first terminals of the first plurality of semiconductor devices and to define vertical vias with the conductive portion of each of the first terminal semiconductor contacts providing a lower surface of one each of the vias. Polysilicon is grown or deposited on the conductive portion of each of the first terminal semiconductor contacts in the vias to form conduction channels for the first plurality of semiconductor devices. An upper portion of the polysilicon in the vias is doped to form second terminal semiconductor contacts for the first plurality of semiconductor devices. The polysilicon conduction channels and the polysilicon second terminal semiconductor contacts are annealed, before or after the doping, to expand the grains and avoid grain boundaries within a conductive portion of each of the conduction channels and the second terminal semiconductor contacts. A second electrically conductive layer is deposited and patterned on the second terminal semiconductor contacts to define second terminals and interconnects of the first plurality of semiconductor devices.

A second, third, etc. plurality of semiconductor devices is fabricated on each succeeding plurality of semiconductor devices by repeating the above steps and generally using the upper electrically conductive layer of the previous plurality of semiconductor devices as the first electrically conductive layer of the succeeding plurality of semiconductor devices. Also, in a preferred embodiment the various annealing steps are performed with a laser to reduce the heat on other components in the circuit.

BRIEF DESCRIPTION OF THE DRAWINGS

Referring to the drawings.

DESCRIPTION OF THE PREFERRED EMBODIMENT

Figure 1:
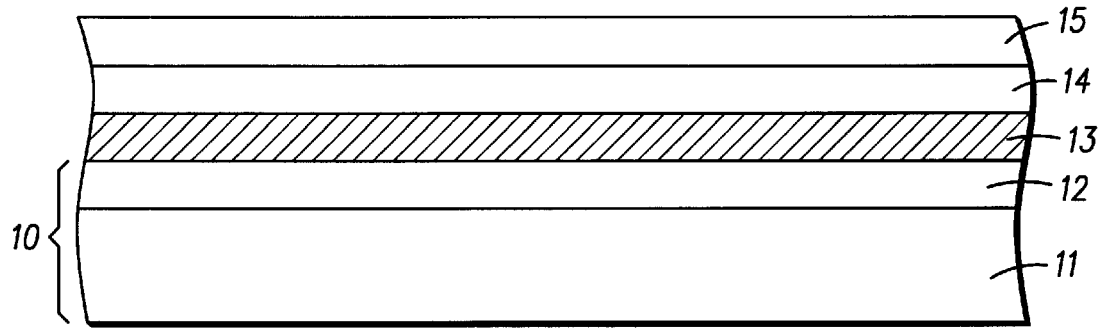
FIGS 1, 2, 3, and 4 are simplified sectional views, portions thereof broken away, of several sequential steps in a 3D semiconductor circuit fabrication process in accordance with the present invention.

Turning now to the drawing and specifically FIG. 1, a simplified sectional view is illustrated of a first step in a 3D semiconductor circuit fabrication process in accordance with the present invention. A substrate 10 is provided which may be formed of silicon, glass, or any other suitable material 11. In instances where substrate 10 is or includes electrically conductive material, integrated circuits, or the like, an insulating layer 12 is formed on the top of substrate 10 and is considered herein as coming within the term "substrate". A bottom electrically conductive layer 13, which may include metal, silicide, heavily doped semiconductor material or any other appropriately conductive material, is formed on the surface of substrate 10. Layer 13 is formed by any convenient technique as, for example, by a deposition such as evaporation or the like, doping by diffusion or implantation, etc.

Figure 2:
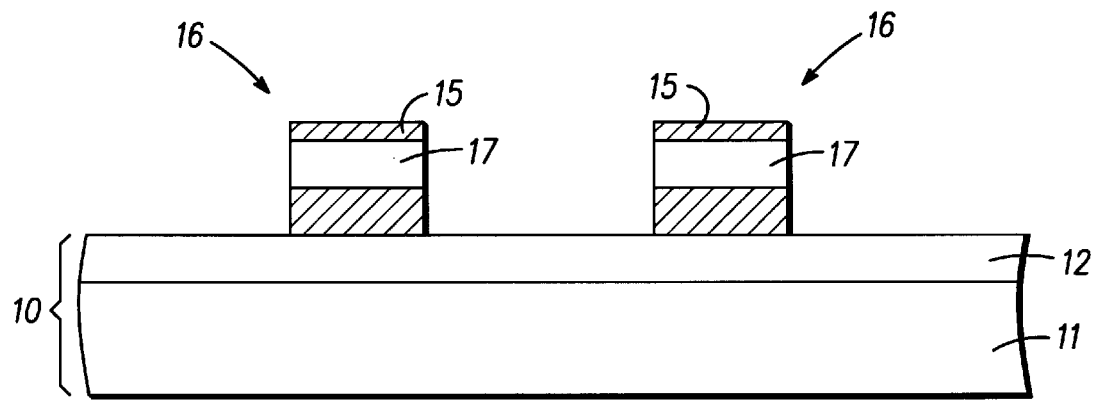

A polysilicon layer 14 is deposited on the surface of layer 13. Polysilicon layer 14 is doped, either during or after deposition, to form p-type or n-type conduction for device contacts, such as source or drain contacts. An insulative layer 15 is deposited on the upper surface of polysilicon layer 14 and the structure is patterned, as illustrated in FIG. 2, into submicron geometries, including lower terminals 16 of a first plurality of semiconductor devices. The patterning can be performed using any conventional masking and etching technique used in the semiconductor industry. Also, the submicron geometries will generally include interconnections between semiconductor devices.

The portion of polysilicon layer 13 included in each of the lower terminals 16 forms a lower terminal semiconductor contact 17 and is generally annealed subsequent to the patterning step to expand the polysilicon grains. In a preferred embodiment the annealing is performed using a laser, which allows lower temperature annealing as opposed to, for example, rapid temperature anneal (RTA) processes, thereby producing less effect on other components of the structure. Thus, it is most expedient to anneal the semiconductor contacts at this point in the process when they are readily accessible to laser annealing. Annealing semiconductor contacts 17 expands the crystal grains to substantially avoid grain boundaries within a conductive portion of each of semiconductor contacts 17. However, factors such as the size of the semiconductor device being fabricated, anneal temperatures and time, etc. determine the size of a grain relative to the semiconductor device.

In practice, the process is initially performed by annealing and testing either a single semiconductor contact 17 or a complete semiconductor device to determine the optimum anneal conditions and semiconductor size to achieve the least grain boundaries within the semiconductor device. For example, a common anneal time and temperature is performed on a semiconductor contact 17 and the conductivity of the contact is tested. As the number of grain boundaries within semiconductor contact 17 are reduced, a conductive portion is formed with increased conductivity. By changing the anneal times and temperatures and testing the conductivity after each change, an optimum anneal can be achieved. Also, within the limits of present patterning techniques, the size of semiconductor contacts 17 can be altered to more closely fit the size of the expanded grains. In an optimum situation each semiconductor contact 17 becomes a single grain or crystal.

Figure 3:
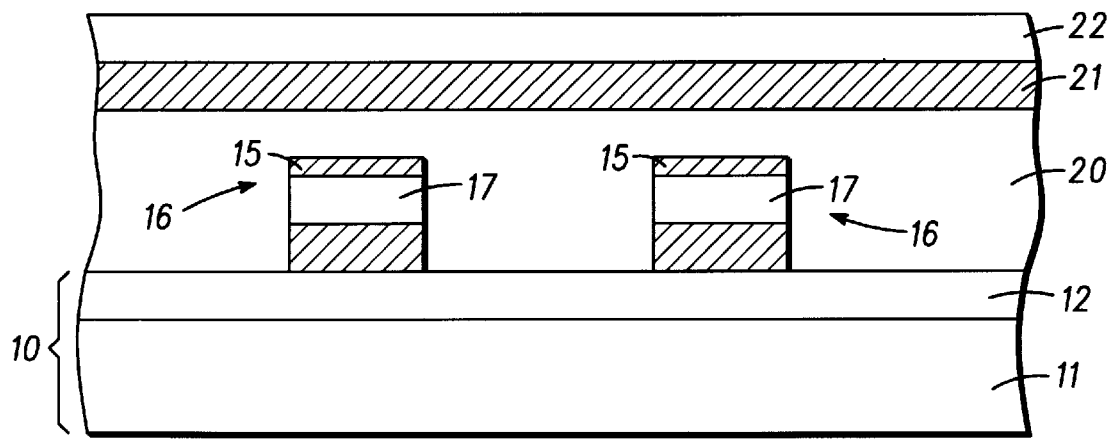

Turning now to FIG. 3, a layer 20 of dielectric material is deposited over the entire structure and planarized by any convenient technique as, for example, by chemical mechanical polishing. A gate contact layer 21 is deposited on the planarized surface of layer 20 and an insulator layer 22 is deposited over the surface of gate contact layer 21. In a preferred embodiment, gate contact layer 21 is formed of polysilicon but it will be understood by those skilled in the art that other well known contact materials may be utilized and that polysilicon is included herein for its convenience in the process.

Figure 4:
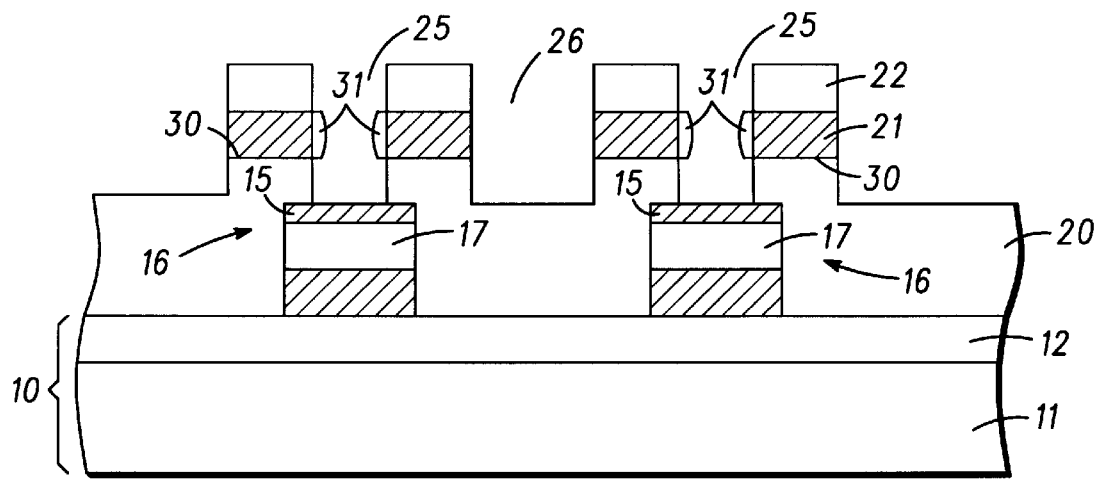

As illustrated in FIG. 4, the structure is patterned to open vias 25 through insulator layer 22, gate contact layer 21 and a portion of layer 20 to insulative layer 15. Also, the patterning separates gate contact layer 21 into individual gate contacts 30 as, for example, by opening 26 and provides interconnections, external connections, or connecting junctions (not shown) to gate contacts 30. It should be understood that vias 25 are generally formed with a circular cross-section so that gate contacts 30 form a wrap-around gate. Gate contacts 30 are then oxidized, if the material is polysilicon, to form a gate insulator layer 31 within each of the vias 25. Oxidized portions other than in vias 25 are not shown since they will have no effect on the structure. When the oxidizing step is complete, insulative layer 15 on the upper surface of each semiconductor contact 17 is removed to expose semiconductor contacts 17 at the bottom of each via 25.

Figure 5:
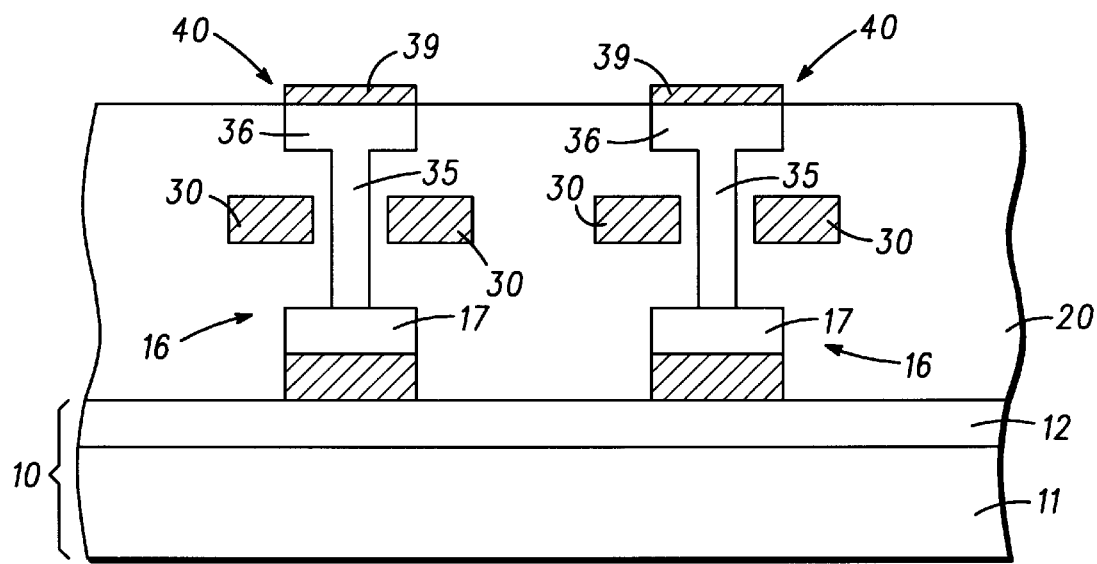
FIG. 5 is a simplified sectional view, portions thereof broken away, of final steps in the 3D semiconductor circuit fabrication process.

Turning now to FIG. 5, polysilicon is deposited in vias 25 to form a conduction channel 35 and a top semiconductor contact 36. Additional dielectric material, generally similar to layer 20 and designated 20 herein is formed between devices and the entire structure is planarized. The polysilicon defining conductive channels 35 is grown in the vertical direction which enables accurate control of the thickness (conduction channel length) in the vertical direction.

The top portion of the polysilicon is doped by any convenient technique, such as diffusion or implanting, to form top semiconductor contact 36. Before or after doping the polysilicon is annealed, generally as described in conjunction with semiconductor contact 17, to expand the crystal grains and substantially avoid grain boundaries within a conductive portion of each of conductive channels 35 and top semiconductor contacts 36. In some instances it may be possible to grow single crystal silicon in vias 25 using semiconductor contacts 17 as seed material. As previously explained, the annealing is preferably performed by using a laser and the process is optimized by an anneal and test procedure to achieve the optimum results. In either case, the lateral size of the semiconductor devices can be limited to sizes much smaller than the size of the expanded polysilicon grains so as to avoid the presence of grain boundaries within the active region of the semiconductor devices.

A metal layer is deposited on the upper surface of the device and patterned, utilizing any of the conventional semiconductor techniques, to form a second electrically conductive contact 39 on each semiconductor contact 36 to define second terminals of plurality of semiconductor devices 40. The metal layer is also patterned to define interconnects and the like (not shown).

Figure 6:
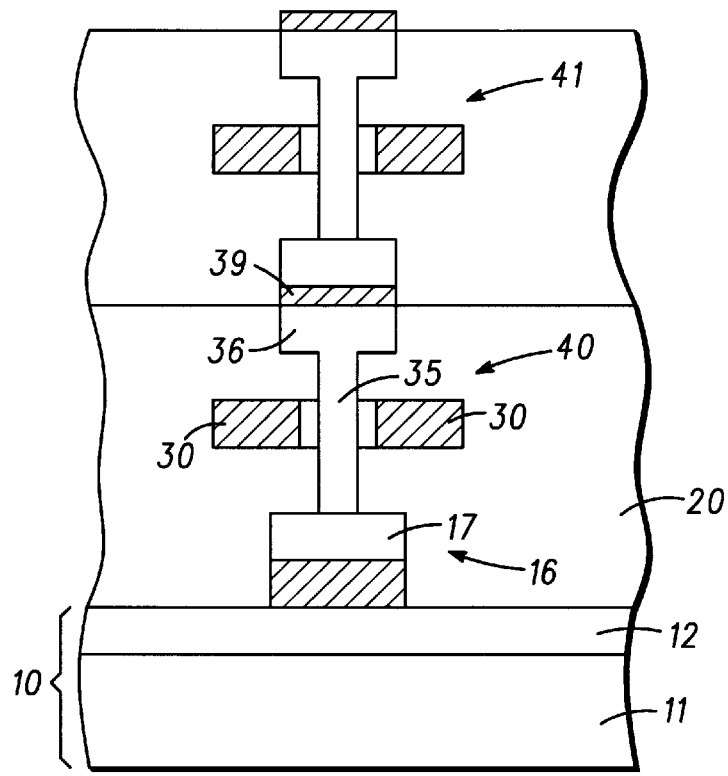
FIG. 6 is a simplified sectional view, portions thereof broken away, of a complementary pair of semiconductor devices in accordance with the present invention.

Turning now to FIG. 6, a simplified sectional view, portions thereof broken away, is illustrated of a complementary pair of semiconductor devices 40 and 41 in accordance with the present invention. In this specific embodiment semiconductor device 40 is the device illustrated in FIG. 5. Also, in this specific embodiment second electrically conductive contact 39 of semiconductor device 40 is utilized as a bottom electrically conductive layer for semiconductor device 41. Semiconductor device 41 is fabricated on semiconductor device 40 by repeating the steps described above. Also, semiconductor device 40 is doped for a first conductivity, in this example N-P-N and semiconductor device 41 is doped for the opposite conductivity, in this example P-N-P, to form an interconnected complementary pair. Although the embodiment shown in FIG. 6 illustrates one device directly on top of the other with the same size, it should be understood that complementary devices (as well as devices simply included in the same circuit) can be placed adjacent each other on the same or different levels and can also be of different sizes.

Figure 7:
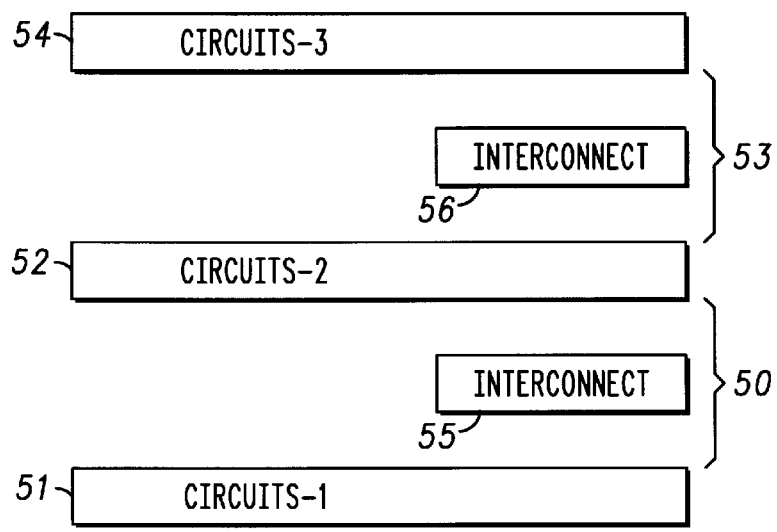
FIG. 7 is a simplified cross-sectional view of a plurality of stacked semiconductor circuits in accordance with the present invention.

In a somewhat different embodiment, illustrated in FIG. 7, a suitable buffer layer or layers 50 are deposited over a first circuit or structure 51 (e.g. that illustrated in FIG. 5) and a second layer of semiconductor devices 52 is fabricated by repeating the steps described above. Additional layers are added by depositing a third buffer layer or layers 53 and fabricating a third layer of semiconductor devices 54. In this embodiment the buffer layer or layers not only acts as an insulator between layers of devices but also as a shield from process conditions the upper layer of devices is being exposed to during the fabrication process. The material chosen for the buffer layer or layers can not only act as a thermal and electrical shield but in some cases one suitable for creating high quality polysilicon material.

The vertically stacked layers of components or circuits is interconnected by means of interconnecting metal lines 55 and 56, respectively, that are much shorter as compared to the long metal lines used in conventional two dimensional arrays of devices. Generally, the length of interconnecting lines in the three dimensional circuits of the present invention are reduced to a few microns instead of the 100's of microns or even millimeters required in conventional two dimensional technology. The three dimensional circuits described herein result in a very high density of circuit integration. Since the devices are at closer proximity, the drive requirement and fan-out requirement of devices is less stringent and results in lower power dissipation. Also, the three dimensional nature of this integration enables contacts to all faces of the three dimensional die, increasing the number of I/O leads possible. Further, over all improvement in complexity, performance is realized with the present novel approach for stacking multiple layers of semiconductor devices by depositing non-single crystal material to begin with, on a suitable buffer layer and processing it to obtain acceptable device performance.

Accordingly, a convenient method of producing efficient three dimensional semiconductor circuits is disclosed, which results in improved 3D semiconductor circuits with increased density and minimum interconnect lengths. Further, the new and improved method of producing 3D semiconductor circuits is convenient and easy to perform without introducing additional cost and labor is capable of producing larger and more complicated semiconductor circuits with reduced RC time constants, clock skew, signal delays, and parasitic leakage. Also, the new method provides new and improved high performance semiconductor devices with high mobility and low leakage current that result in good transistor threshold control, low voltage operation, high drive current, and high fan-out or gain.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating three-dimensional semiconductor circuits comprising the steps of:

providing a first electrically conductive layer having a doped polysilicon layer positioned thereon and patterned into submicron geometries including first terminals of a first plurality of semiconductor devices, the doped polysilicon layer including grains;

annealing the doped polysilicon layer to expand the grains to avoid grain boundaries within a conductive portion of each of the first terminal semiconductor contacts;

forming insulated gate contacts spaced vertically from the first terminals of the first plurality of semiconductor devices so as to define vertical vias with the conductive portion of each of the first terminal semiconductor contacts providing a lower surface of one each of the vias;

depositing polysilicon including grains on the conductive portion of each of the first terminal semiconductor contacts in the vias to form conduction channels for the first plurality of semiconductor devices, an upper portion of the polysilicon in the vias being doped to form second terminal semiconductor contacts for the first plurality of semiconductor devices;

annealing the polysilicon conduction channels and the polysilicon second terminal semiconductor contacts to expand the grains to avoid grain boundaries within a conductive portion of each of the conduction channels and the second terminal semiconductor contacts; and depositing and patterning a second electrically conductive layer on the second terminal semiconductor contacts to define second terminals of the first plurality of semiconductor devices.

2. A method of fabricating three-dimensional semiconductor circuits as set forth in claim 1 wherein the first and second electrically conductive layers include one of metal, silicide, and heavily doped semiconductor material.

3. A method of fabricating three-dimensional semiconductor circuits as set forth in claim 1 wherein the step of annealing includes annealing with a laser.

4. A method of fabricating three-dimensional semiconductor circuits as set forth in claim 1 wherein a second plurality of semiconductor devices is fabricated on the first plurality of semiconductor devices by repeating the steps of claim 1 using the second electrically conductive layer of the first plurality of semiconductor devices as the first electrically conductive layer of the second plurality of semiconductor devices.

5. A method of fabricating three-dimensional semiconductor circuits as set forth in claim 1 wherein a second plurality of semiconductor devices is fabricated on the first plurality of semiconductor devices by forming a buffer layer on the first plurality of semiconductor devices and repeating the steps of claim 1 on the buffer layer.

6. A method of fabricating three-dimensional semiconductor circuits as set forth in claim 5 wherein the step of forming the buffer layer includes forming interconnect lines in the buffer layer.

7. A method of fabricating three-dimensional semiconductor circuits as set forth in claim 6 wherein the first plurality of semiconductor devices and the second plurality of semiconductor devices form a three dimensional semiconductor block with contacts to external pads being formed on all facets of the block.

8. A method of fabricating three-dimensional semiconductor circuits as set forth in claim 4 wherein at least one of the second plurality of semiconductor devices cooperates with at least one of the first plurality of semiconductor devices to form a complementary pair of devices.

9. A method of fabricating three-dimensional semiconductor circuits comprising the steps of:

providing a substrate;

depositing a first electrically conductive layer on the substrate;

depositing a doped polysilicon layer having grains on the first electrically conductive layer;

depositing a first insulative layer on the doped polysilicon layer;

patterning the first electrically conductive layer, the doped polysilicon layer, and the first insulative layer into submicron geometries including first terminals of a first plurality of semiconductor devices;

annealing the patterned doped polysilicon layer to expand the grains to avoid grain boundaries within a conductive portion of each of the first terminals of the first plurality of semiconductor devices;

depositing and planarizing a dielectric layer over the submicron geometries;

depositing a polysilicon gate contact layer on the dielectric layer;

depositing a second insulative layer on the polysilicon gate contact layer;

opening vias through the second insulative layer, the polysilicon gate contact layer, and the dielectric layer to the first insulative layer, the vias defining conduction channels for the first plurality of semiconductor devices;

oxidizing exposed portions of the polysilicon gate contact layer within the vias to form a gate dielectric layer;

removing the first insulative layer within the vias to expose the conductive portion of each of the first terminals within each of the vias;

depositing polysilicon with grains on the conductive portion of the first terminal semiconductor contacts in each of the vias to form the conduction channels for the first plurality of semiconductor devices;

doping a top portion of the polysilicon in the vias to form second terminal semiconductor contacts for the first plurality of semiconductor devices;

annealing the polysilicon conduction channels and the polysilicon second terminal semiconductor contacts to expand the grains to avoid grain boundaries within a conductive portion of each of the conduction channels and the second terminal semiconductor contacts; and depositing and patterning a second electrically conductive layer on the second terminal semiconductor contacts to define second terminals of the first plurality of semiconductor devices.

10. A method of fabricating three-dimensional semiconductor circuits as set forth in claim 9 wherein the first and second electrically conductive layers include one of metal, silicide, and heavily doped semiconductor material.

11. A method of fabricating three-dimensional semiconductor circuits as set forth in claim 9 wherein the step of annealing includes annealing with a laser.

12. A method of fabricating three-dimensional semiconductor circuits as set forth in claim 9 wherein a second plurality of semiconductor devices is fabricated on the first plurality of semiconductor devices by depositing a second doped polysilicon layer with grains on the second electrically conductive layer of the first plurality of semiconductor devices;

depositing a third insulative layer on the second doped polysilicon layer;

patterning the second doped polysilicon layer, and the third insulative layer into submicron geometries including first terminals of the second plurality of semiconductor devices;

annealing the patterned second doped polysilicon layer to expand the grains to avoid grain boundaries within a conductive portion of each of the first terminals of the second plurality of semiconductor devices;

depositing and planarizing a second dielectric layer over the submicron geometries of the second plurality of semiconductor devices;

depositing a second polysilicon gate contact layer on the second dielectric layer;

depositing a fourth insulative layer on the second polysilicon gate contact layer;

opening second vias through the fourth insulative layer, the second polysilicon gate contact layer, and the second dielectric layer to the third insulative layer, the second vias defining conduction channels for the second plurality of semiconductor devices;

oxidizing exposed portions of the second polysilicon gate contact layer within the second vias to form a second gate dielectric layer;

removing the third insulative layer within the second vias to expose the conductive portion of each of the first terminal semiconductor contacts of the second plurality of semiconductor devices within the second vias;

depositing second polysilicon with grains on the conductive portion of the first terminal semiconductor contacts in the second vias to form the conduction channels for the second plurality of semiconductor devices;

doping a top portion of the second polysilicon in the second vias to form second terminal semiconductor contacts for the second plurality of semiconductor devices;

annealing the polysilicon conduction channels and the polysilicon second terminal semiconductor contacts to expand the grains to avoid grain boundaries within a conductive portion of each of the conduction channels and the second terminal semiconductor contacts; and depositing and patterning a third electrically conductive layer on the second terminal semiconductor contacts of the second plurality of semiconductor devices to define second terminals of the second plurality of semiconductor devices.

13. A method of fabricating three-dimensional semiconductor circuits as set forth in claim 12 wherein at least one of the second plurality of semiconductor devices cooperates with at least one of the first plurality of semiconductor devices to form a complementary pair of devices.

14. A method of fabricating three-dimensional semiconductor circuits as set forth in claim 9 wherein a second plurality of semiconductor devices is fabricated on the first plurality of semiconductor devices by repeating the steps of claim 9, and repeating the step of providing a substrate in the fabrication of the second plurality of semiconductor devices includes forming a buffer layer on the first plurality of semiconductor devices.

15. A method of fabricating three-dimensional semiconductor circuits as set forth in claim 14 wherein the step of forming the buffer layer includes forming interconnect lines between the first and second pluralities of semiconductor devices in the buffer layer.

16. A method of fabricating three-dimensional semiconductor circuits as set forth in claim 15 wherein the first plurality of semiconductor devices and the second plurality of semiconductor devices form a three dimensional semiconductor block with contacts to external pads being formed on all facets of the block.

* * * * *